(12) United States Patent
Guo et al.

(10) Patent No.: US 8,288,217 B2
(45) Date of Patent: Oct. 16, 2012

(54) STRESSOR IN PLANAR FIELD EFFECT TRANSISTOR DEVICE

(75) Inventors: Dechao Guo, Wappingers Falls, NY (US); Pranita Kulkarni, Slingerlands, NY (US); Philip J. Oldiges, Lagrangeville, NY (US); Alexander Reznicek, Mount Kisco, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 12/945,026

(22) Filed: Nov. 12, 2010

(65) Prior Publication Data

US 2012/0119266 A1 May 17, 2012

(51) Int. Cl.
*H01L 21/338* (2006.01)
(52) U.S. Cl. . 438/183; 438/700; 438/712; 257/E21.051; 257/E21.127; 257/E21.218; 257/E21.221; 257/E21.229; 257/E21.267; 257/E21.304; 257/E21.4; 257/E21.37
(58) Field of Classification Search .................. 438/183, 438/197, 456, 692, 706, 712, 752, 753, 833, 438/769, 933, 700; 257/E21.051, E21.127, 257/E21.218, E21.221, E21.229, E21.267, 257/E21.304, E21.37, E21.4, 192, 213
See application file for complete search history.

(56) References Cited

U.S. PATENT DOCUMENTS

| 7,585,773 | B2 | 9/2009 | Fang et al. | |
| 2008/0237680 | A1* | 10/2008 | Pangal et al. | 257/315 |
| 2009/0309159 | A1* | 12/2009 | Morita et al. | 257/347 |

OTHER PUBLICATIONS

Dechao Guo et al., pending U.S. Appl. No. 12/625,827 entitled "Embedded Stressor for Semiconductor Structures," filed Nov. 25, 2009.

* cited by examiner

*Primary Examiner* — David Nhu
(74) *Attorney, Agent, or Firm* — Cantor Colburn LLP; Vazken Alexanian (57) ABSTRACT

A field effect transistor device includes a gate stack portion disposed on a substrate, and a channel region in the substrate having a depth partially defined by the gate stack portion and a silicon region of the substrate, the silicon region having a sloped profile such that a distal regions of the channel region have greater depth than a medial region of the channel region.

18 Claims, 7 Drawing Sheets

STRESSOR IN PLANAR FIELD EFFECT TRANSISTOR DEVICE

FIELD OF INVENTION

The present invention relates to planar semiconductor field effect transistors.

DESCRIPTION OF RELATED ART

Planar semiconductor field effect transistor devices typically included a gate stack structure that may include dielectric layer such as an oxide or high-k layer disposed on a channel region of a silicon substrate. A gate layer such as a metallic gate material is disposed on the dielectric layer, and a polysilicon layer may be disposed on the gate material. Source and drain regions in the substrate may be disposed adjacent to the channel region.

Since it has become increasingly difficult to improve metal oxide semiconductor field effect transistors (MOSFETs) and therefore complimentary metal oxide semiconductor (CMOS) performance through continued scaling, methods for improving performance with scaling have become critical. One approach for doing this is to increase carrier (electron and/or hole) mobility. CMOS scaling has been mainly driven by stress induced carrier mobility enhancement since 90 nm technology node. Increased carrier mobility can be obtained, for example, by introducing the appropriate stress/strain into the semiconductor lattice.

The application of stress changes the lattice dimensions of the semiconductor substrate. By changing the lattice dimensions, the electronic band structure of the material is changed as well. The change may only be slight in intrinsic semiconductors resulting in only a small change in resistance, but when the semiconducting material is doped, i.e., n-type, and partially ionized, a very small change in the energy bands can cause a large percentage change in the energy difference between the impurity levels and the band edge. This results in changes in carrier transport properties, which can be dramatic in certain cases. The application of physical stress (tensile or compressive) can be farther used to enhance the performance of devices fabricated on the semiconductor substrates.

Compressive strain along the device channel increases drive current in p-type field effect transistors (pFETs) and decreases drive current in n-type field effect transistors (nFETs). Tensile strain along the device channel increases drive current in nFETs and decreases drive current in pFETs. Stress can be introduced into a single crystal oriented substrate by several methods including, for example, forming a stress liner on top of the substrate and around the gate region. Depending on the conductivity type of the FET (i.e., p or n), the stress liner can be under tensile stress (preferred for nFETs) or compressive stress (preferred for pFETs).

In order to enhance MOSFET performance in the 65 nm technology node and below, stress liners are applied after salicide formation. The liner stress is transferred to the device channel thereby enhancing the carrier mobility. In MOSFETs, there is normally a nitride or oxide/nitride spacer(s) that is used to offset the source/drain dopant from channel, and to prevent silicide from shorting to gate and from punching through the shallow extension region. The stress transfer from liner to MOSFET channel is limited by the existence of the spacer due to proximity effects.

Accordingly, there are continuing efforts to enhance stress in semiconductor devices and thus achieve greater carrier mobility and ultimately greater device performance.

BRIEF SUMMARY

In one aspect of the present invention, a field effect transistor device includes a gate stack portion disposed on a substrate, and a channel region in the substrate having a depth partially defined by the gate stack portion and a silicon region of the substrate, the silicon region having a sloped profile such that a distal regions of the channel region have greater depth than a medial region of the channel region.

In another aspect of the present invention, a method for forming a semiconductor device, includes forming a dummy gate stack on a substrate, the substrate including a silicon region and a shallow trench isolation (STI) region, anisotropically etching the silicon region to form a silicon portion having sloped sides, wherein the etching forms a cavity defined by the STI region, the silicon portion, and the dummy gate stack, forming a channel region on the silicon portion, removing the dummy gate stack, forming a gate stack on the channel region, and forming a source region and a drain region adjacent to the channel region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 4-9 illustrate an exemplary embodiment of a fabrication method of the device of FIG. 2A, in which:

DETAILED DESCRIPTION

Figure 1:
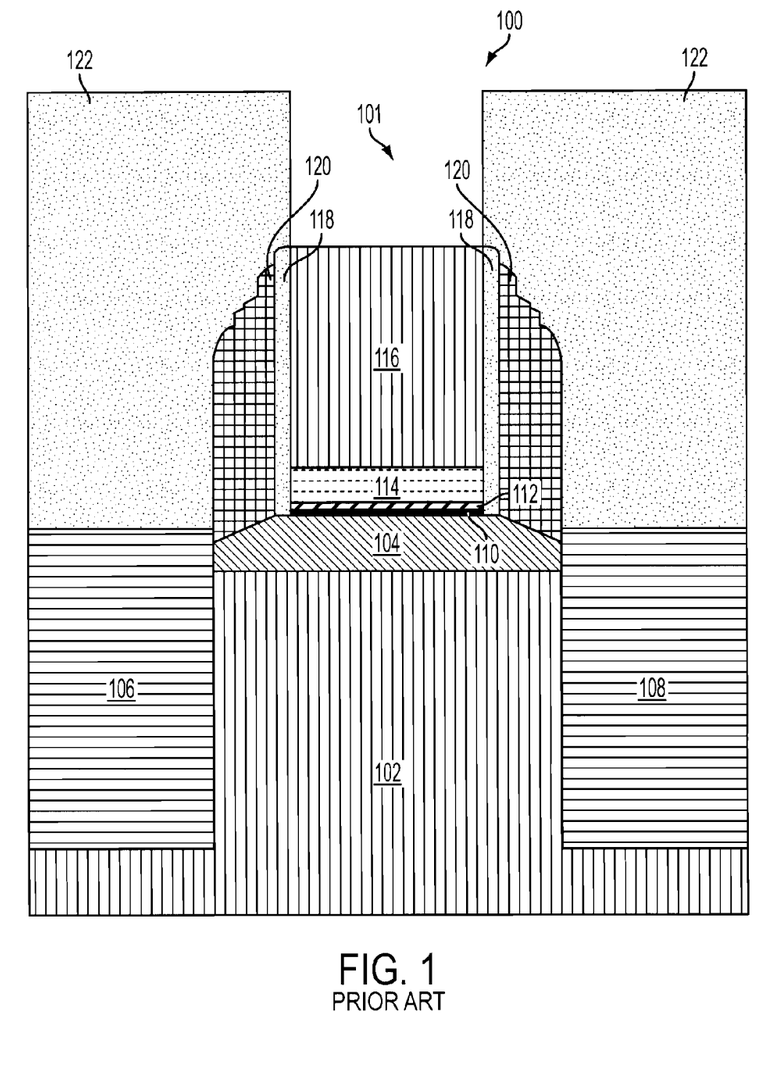
FIG. 1 illustrates a prior art example of a planar field effect transistor device.

FIG. 1 illustrates a prior art example of a planar field effect transistor device 100. The device 100 includes a substrate having a silicon portion 102 and a silicon germanium (SiGe) channel region 104. A source region 106 and a drain region 108 are formed from epitaxially grown SiGe. A gate stack portion 101 includes an oxide or high-K layer 110 disposed on the channel region 104. A dielectric layer 112 is disposed on the layer 110. A metal gate layer 114 that may include, for example, titanium nitride is disposed on the dielectric layer 112. A polysilicon capping layer 116 is formed on the metal gate layer 114. Spacers may be formed adjacent to the gate stack portion 101. The spacers may include a nitride spacer 118 and an oxide spacer 120. A stress liner layer 122 is formed over portions of the source and drain regions 106 and 108 and the spacers 118 and 120. The stress liner layer 122 may be formed from, for example, a nitride film.

Figure 2A:
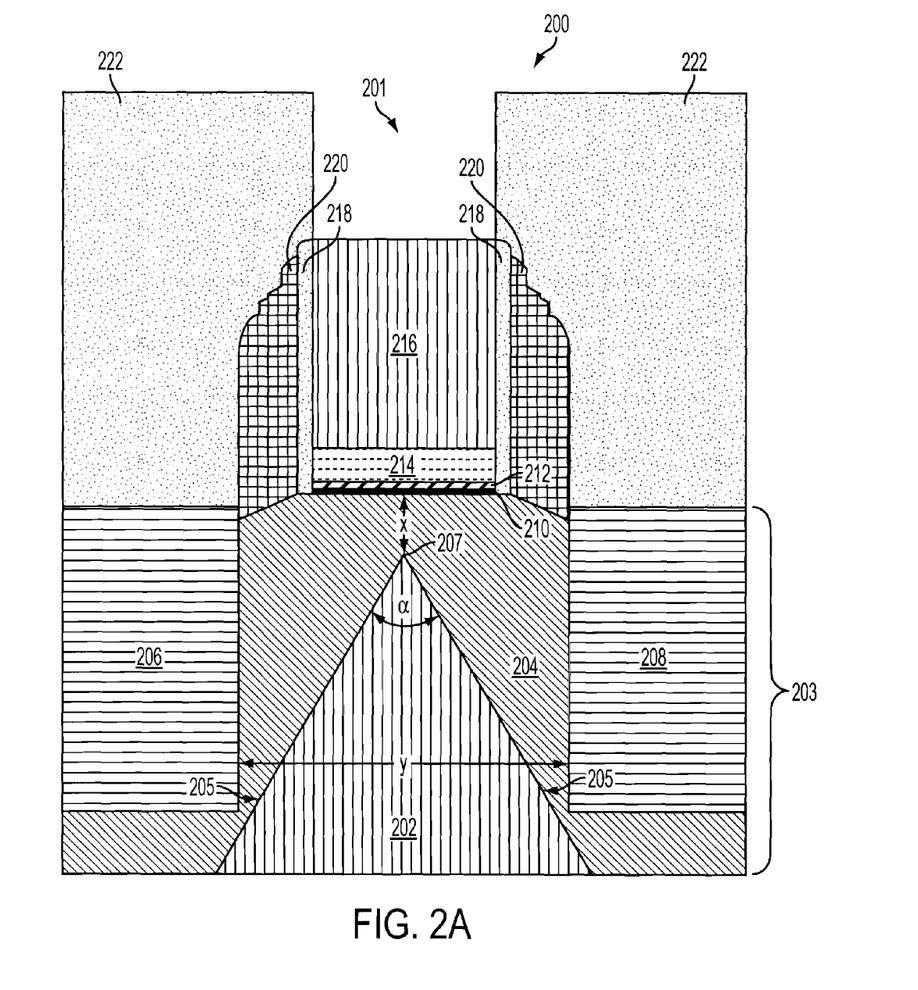
FIGS. 2A and 2B illustrate an exemplary embodiment of a planar field effect transistor device.

FIG. 2A illustrates an exemplary embodiment of a planar field effect transistor device 200. The device includes a substrate 203 that includes a silicon portion 202 and a SiGe portion 204. A source region 206 and a drain region 208 are disposed adjacent to the SiGe portion 204. The source region 206 and the drain region 208 may include SiGe that may be epitaxially formed. A gate stack portion 201 is formed on the SiGe portion 204 of the substrate 203. The gate stack portion 201 may include, for example, an oxide or a high-K layer 210 disposed on the SiGe portion 204; a dielectric layer 212 disposed on the layer 210; a metallic gate layer 214 disposed on the dielectric layer 212; and a polysilicon capping layer 216 formed on the metallic gate layer 214. Spacer portions such as, for example, a nitride spacer 218 and an oxide spacer 220 may be disposed adjacent to the gate stack portion 201. A stress liner layer 222 is disposed on the source and drain regions 206 and 208 and on the spacers 218 and 220.

The SiGe portion 204 has a width (y). The silicon portion 202 has a profile with oblique sloped or beveled sides 205 defining an angle ($\alpha$) that converge in a region 207. The angle $\alpha$ may range from, for example, 60-85 degrees. The region 207 and the layer 210 define a depth (x) that is approximately 4-8 nanometers in the SiGe portion 204.

Figure 2B:
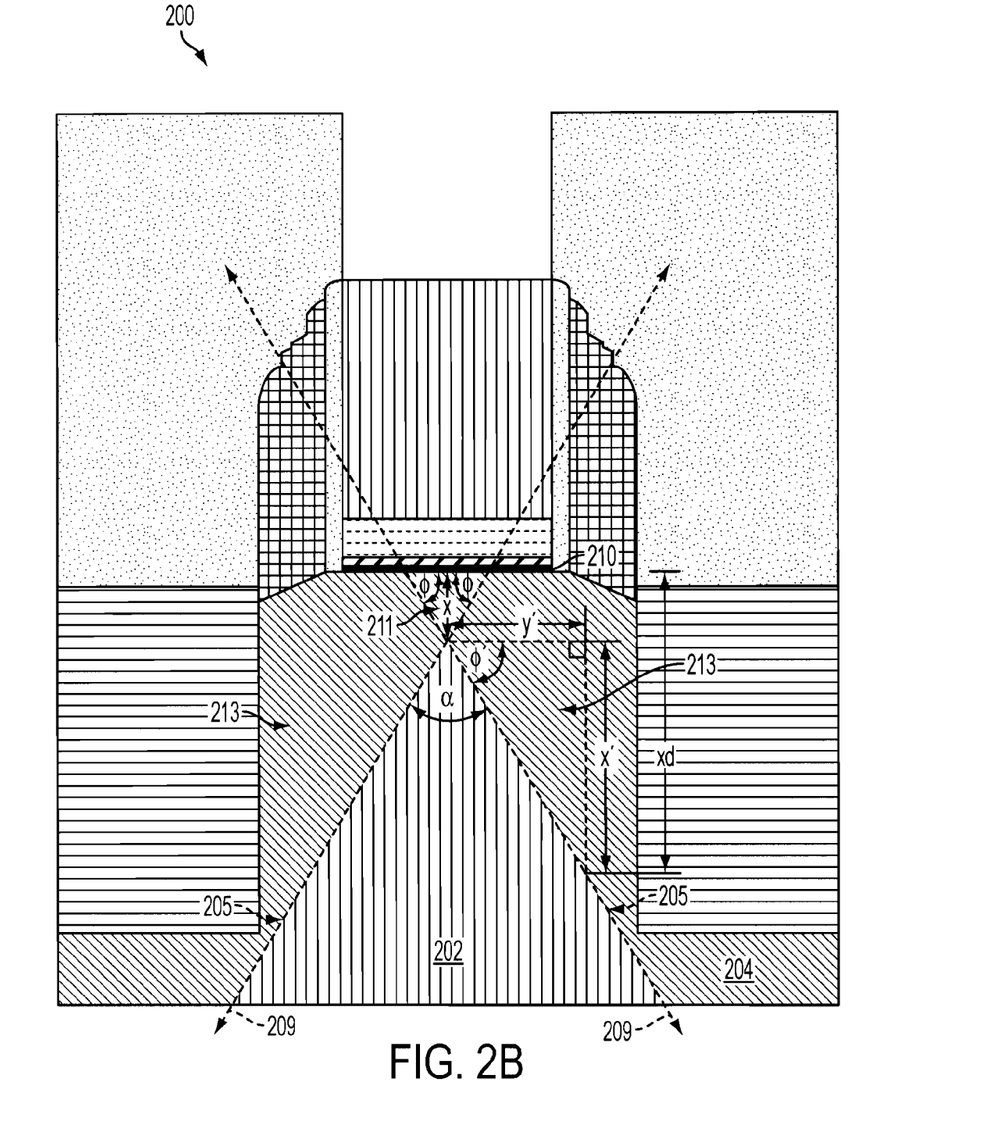

FIG. 2B includes the device 200 and further illustrates the geometric relationship of the SiGe portion 204 and the silicon portion 202. In this regard, the angular relationship between the sides 205 and a planar surface of the layer 210 of gate stack portion 201 may be further defined by planes 209 parallel to the sides 205 that bisects the layer 210 at an angle ($\phi$); where $\phi=(180-\alpha)/2$. The SiGe portion 204 has a thickness (depth) x in the medial region 211 of the SiGe portion 204, and a gradually increasing depth $x_d$ greater than x (defined by the layer 201 and the silicon portion 202) in distal regions 213 of the SiGe portion 204, where $x_d=x+x'$. The $x_d$ depth may be determined at a given distance (y') from the medial region by solving for x' where $\phi'=\phi$ and $x'=\sin(\phi')*y'$.

Figure 3:
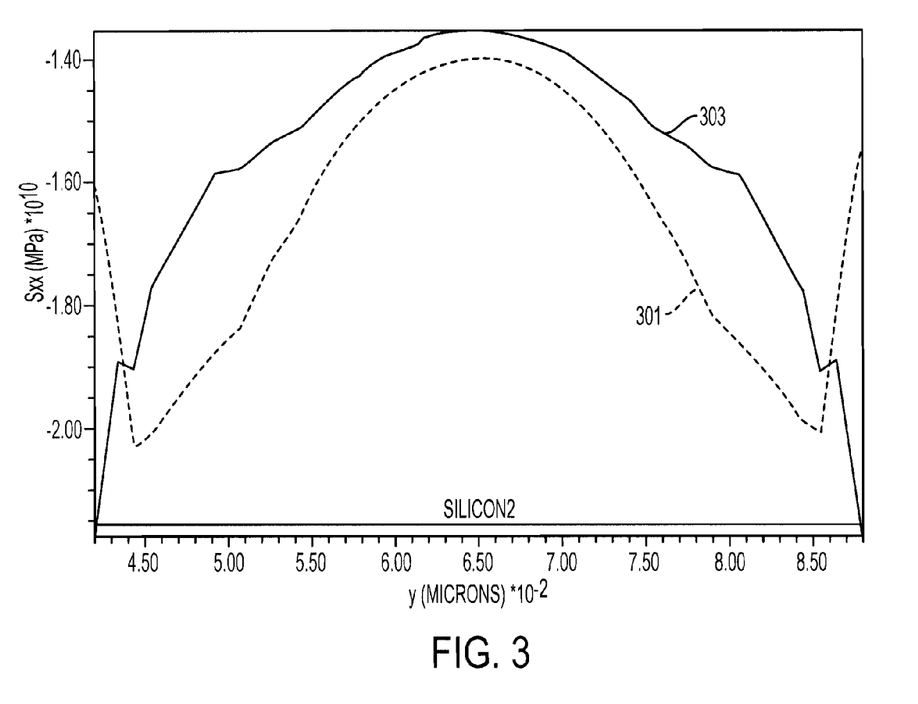
FIG. 3 is a graph illustrating exemplary data from a simulated test of a device similar to the devices of FIGS. 1, 2A, and 2B.

FIG. 3 is a graph illustrating exemplary data from a simulated test of a device similar to the device 200 (of FIG. 2). In this regard, the stress (in MPa) of a device similar to the prior art device 100 (of FIG. 1) is shown by the line 301 while the stress of a device similar to the device 200 is shown by the line 303. The center of the graph (at approximately 0.065 microns) represents the median of the SiGe portion 204. The measured stress of the device 200 is greater than the measured stress of the prior art device 100. The increased stress of the device 200 has shown a gain of approximately 12% in hole mobility over the prior art device 100.

Figure 4:
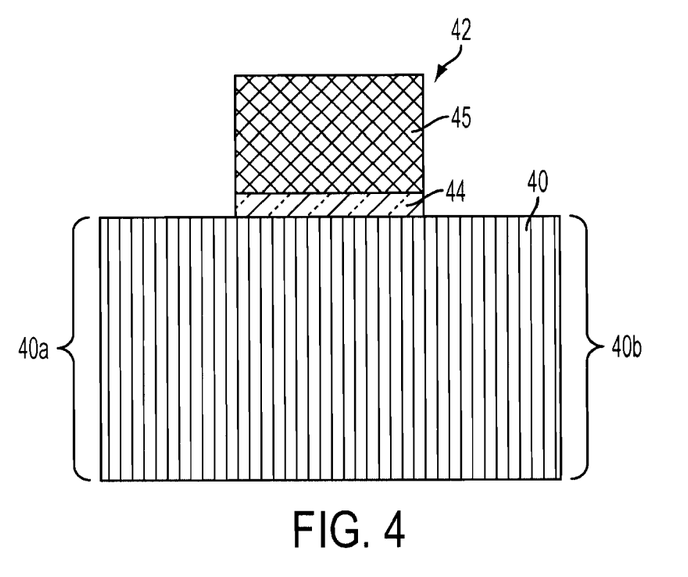
FIG. 4 illustrates a dummy gate stack formed on a substrate.

FIGS. 4-9 illustrate an exemplary embodiment of a fabrication method of the device 200 (of FIG. 2A) described above. Referring to FIG. 4, a substrate 40 of silicon is provided. The substrate 40 includes sidewall portions 40a and 40b. A dummy gate stack 42 is formed over the substrate 40. The dummy gate stack 42 may include an insulating layer 44 formed of silicon oxynitride (SiON), for example, and a gate electrode 45. The dummy gate stack 42 is used to first form an embedded stressor and is then replaced by a functional gate stack during a replacement gate process after the subsequent processing operations have been completed.

Figure 5:
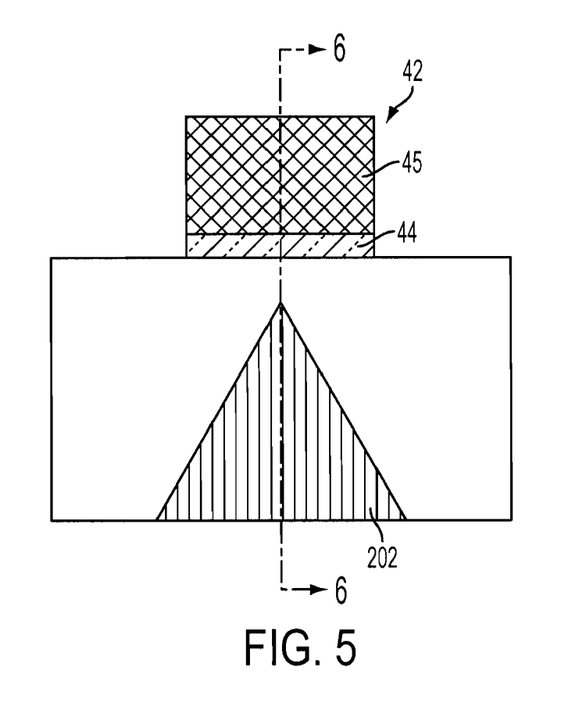
FIG. 5 illustrates the resultant structure following an etching process.

FIG. 5 is a diagram illustrating an exemplary etching operation of the substrate 40 material. As shown in FIG. 5, according to one embodiment, the sidewall portions 40a and 40b of the substrate 40 subjacent to the dummy gate stack 42 are anistropically etched to form the silicon portion 202. Any conventional etching process may be performed. According to an embodiment of the present invention, anistropically etching of the sidewall portions 42a and 42b forms a triangular-shaped silicon portion 202. The anistropic etching process is carried out using the dummy gate stack 42 as a mask to pattern the substrate 40. According to one embodiment of the present invention, the anisotropic etching of the substrate 40 is carried out by using one or more dry-etching processes, such as reactive ion etching (RIE). The dry etching is directional and therefore etches the stressor material in approximately equal rates along each sidewall portion 40a and 40b. The pyramidal shape is formed by wet etching which preferentially etches <111> crystallographic plane relative to the <100> plane.

Figure 6:
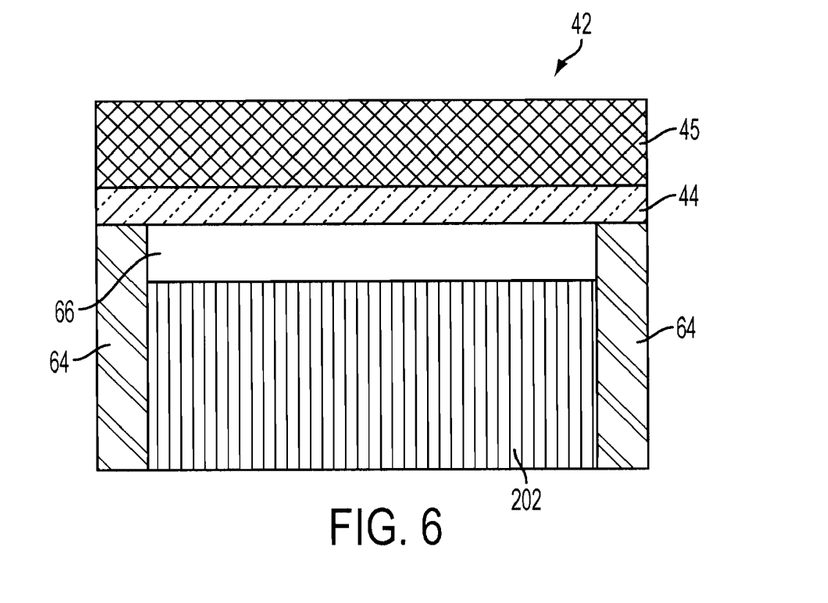
FIG. 6 illustrates a cross-sectional view along the line 6-6 of FIG. 5.

FIG. 6 is a diagram illustrating a cross-sectional view taken along line 6-6 of FIG. 5. As shown in FIG. 6, at least one shallow trench isolation (STI) region 64 adjoins the silicon portion 202. The STI region 64, the insulating layer 44 of the dummy gate stack 42 and the silicon portion 202 define a cavity 66 below the insulating layer 44.

Figure 7:
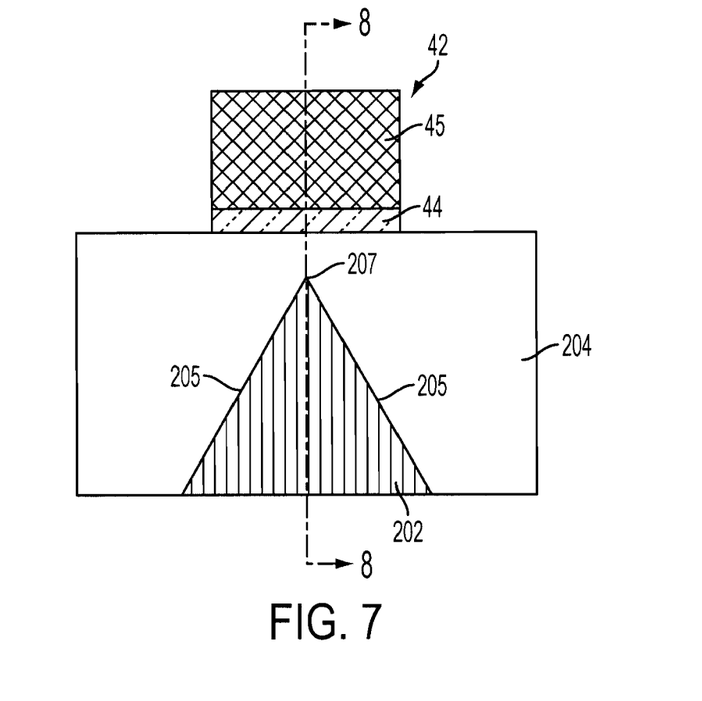
FIG. 7 illustrates the deposition of a semiconductor layer.
Figure 8:
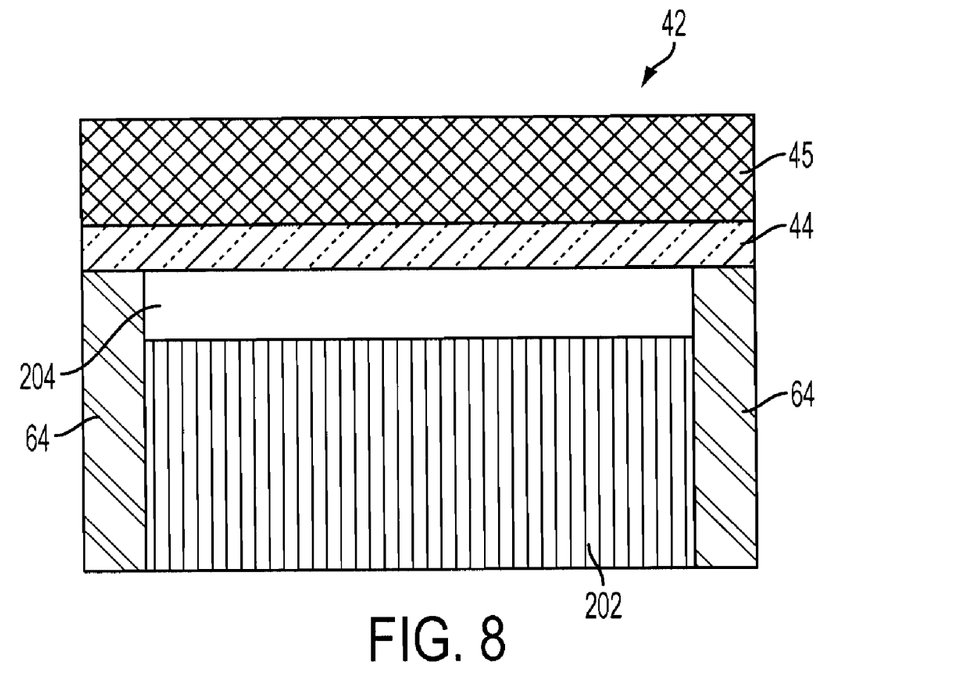
FIG. 8 illustrates a cross-sectional view along the line 8-8 of FIG. 7.

FIG. 7 is a diagram illustrating a deposition operation of a semiconductor layer that can be implemented within embodiments of the present invention. FIG. 8 is a cross-section view taken along line 8-8 of FIG. 7. As shown in FIGS. 7 and 8, the SiGe portion 204 is epitaxially grown on the beveled sides 205 and the region 207 of the silicon portion 202, filling the cavity 66. Alternatively, the SiGe portion 204 may be deposited with other conventional deposition techniques.

Figure 9:
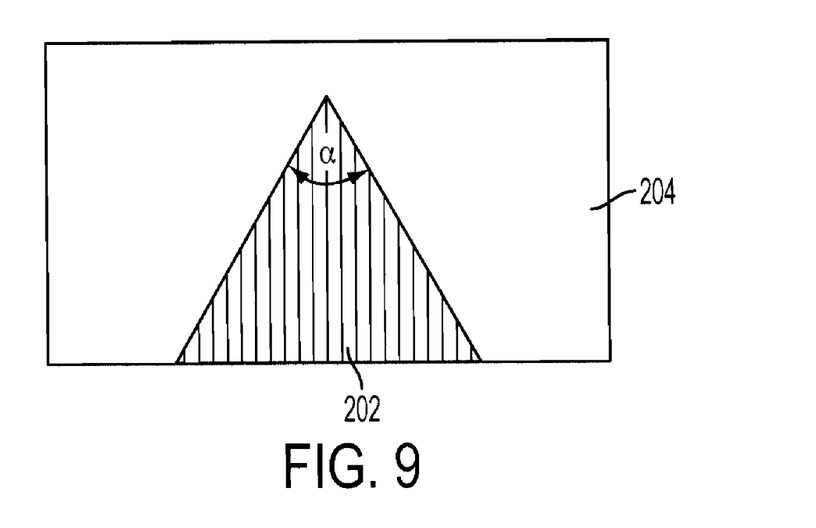
FIG. 9 illustrates the resultant structure following a planarizing operation.

FIG. 9 is a diagram illustrating an exemplary embodiment of a planarizing operation of the conductive material. As shown in FIG. 9, after deposition of the SiGe portion 204, the dummy gate stack 42 is removed. Further, the SiGe portion 204 is planarized by a planarization technique such as chemical mechanical polishing (CMP) however other conventional planarization techniques may be performed. Additional CMOS processing operations, such as source/drain extension implantation, source/drain implantation, can be further carried out to form a complete semiconductor device (as depicted in FIG. 2), which contains a channel region with the desired stress.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor (FET) device including:
    a gate stack portion disposed on a substrate; and
    a channel region in the substrate having a depth partially defined by the gate stack portion and a silicon region of the substrate, the silicon region having a sloped profile such that a distal regions of the channel region have greater depth than a medial region of the channel region.

2. The FET device of claim 1, wherein the channel region includes a silicon germanium (SiGe) material.

3. The FET device of claim 1, wherein the sloped profile includes a first side surface and a second side surface converging in a convergence region having an angle ($\alpha$) defined by the first side surface and the second side surface.

4. The FET device of claim 1, wherein the channel region is disposed on the silicon region.

5. The FET device of claim 1, wherein the channel region is further defined by an adjacent source region and an adjacent drain region.

6. The FET device of claim 5, wherein the device further includes a stress liner layer disposed on the source region and the drain region.

7. The FET device of claim 6, wherein the stress liner layer includes a nitride material.

8. The FET device of claim 1, wherein the gate stack portion includes:
    a first layer disposed on the channel region;
    a dielectric layer disposed on the first layer;
    a metallic gate material layer disposed on the dielectric layer; and
    a capping layer disposed on the metallic gate material layer.

9. The FET device of claim 8, wherein the first layer includes an oxide or a high-K material.

10. The FET device of claim 1, wherein the depth at the medial region of the channel region is between 4 and 8 nanometers.

11. The FET device of claim 1, wherein the sloped profile is at least partially defined by beveled sides converging in a convergence region defining an angle ($\alpha$) between the beveled sides.

12. The FET device of claim 11, wherein the depth of a portion of the channel region increases along an axis extending distally from the convergence region.

13. The FET device of claim 11, wherein the channel region includes a silicon germanium material.

14. A method for forming a semiconductor device, the method including:
    forming a dummy gate stack on a substrate, the substrate including a silicon region and a shallow trench isolation (STI) region;
    anisotropically etching the silicon region to form a silicon portion having sloped sides, wherein the anisotropic etching forms a cavity defined by the STI region, the silicon portion, and the dummy gate stack;
    forming a channel region on the silicon portion;
    removing the dummy gate stack;
    forming a gate stack on the channel region; and
    forming a source region and a drain region adjacent to the channel region.

15. The method of claim 14, wherein the channel region is formed by forming a silicon germanium (SiGe) portion on the silicon portion, wherein the formation of the SiGe portion fills the cavity with SiGe.

16. The method of claim 14, wherein the dummy gate stack includes an insulating layer formed on the substrate and a gate electrode layer formed on the insulating layer.

17. The method of claim 14, wherein the anisotropically etching the silicon region forms the silicon portion having sloped sides arranged at an angle ($\alpha$), wherein $\alpha$ is between 60 and 85 degrees.

18. The method of claim 17, wherein the source region and the drain region are formed by epitaxially growing silicon germanium.

* * * * *